(12) United States Patent
Wen

(10) Patent No.: US 12,733,121 B2
(45) Date of Patent: Sep. 8, 2026

(54) CIRCUIT BOARD MOUNTING AND DEMOUNTING DEVICE AND DATA PROCESSING DEVICE

(71) Applicant: ACCTON TECHNOLOGY CORPORATION, Hsinchu City (TW)

(72) Inventor: Hung-Yang Wen, Hsinchu City (TW)

(73) Assignee: ACCTON TECHNOLOGY CORPORATION, Hsinchu City (TW)

( * ) Notice: Subject to any disclaimer, the term of this patent is extended or adjusted under 35 U.S.C. 154(b) by 96 days.

(21) Appl. No.: 19/012,889

(22) Filed: Jan. 8, 2025

(65) Prior Publication Data

US 2025/0386447 A1 Dec. 18, 2025

(30) Foreign Application Priority Data

Jun. 18, 2024 (CN) ......................... 202421384320.7

(51) Int. Cl.
*H05K 7/14* (2006.01)

(52) U.S. Cl.
CPC .................................. *H05K 7/1418* (2013.01)

(58) Field of Classification Search
CPC .................................................... H05K 7/1418
See application file for complete search history.

(56) References Cited

U.S. PATENT DOCUMENTS

2021/0227715 A1* 7/2021 Mao ........................ G06F 1/183
2022/0418133 A1* 12/2022 Zhong .................. H05K 7/1487

* cited by examiner

*Primary Examiner* — Jerry Wu
(74) *Attorney, Agent, or Firm* — Apex Juris, pllc; Cera Oh

(57) ABSTRACT

A circuit board mounting and demounting device, which is used with a guide and fulcrum device, includes at least one actuation mechanism. The at least one actuation mechanism includes a substrate and a linkage assembly. The substrate is connected to a second circuit board and has at least one second guiding portion. The at least one second guiding portion is guided by the guide and fulcrum device. The linkage assembly includes an actuating rod pivotally disposed on the substrate by a pivot shaft. The actuating rod is pivotable between a first position and a second position and one end of the actuating rod abuts against the guide and fulcrum device. When the actuating rod is pivoted from the first position to the second position, the substrate is moved through the at least one second guiding portion along a guiding direction of the at least one guide and fulcrum device.

15 Claims, 11 Drawing Sheets

CIRCUIT BOARD MOUNTING AND DEMOUNTING DEVICE AND DATA PROCESSING DEVICE

BACKGROUND OF THE INVENTION

Technical Field

The present disclosure relates generally to a data processing device, and more particularly to a force-saving circuit board mounting and demounting device with the use of lever principle and a data processing device having the same.

Description of Related Art

With the continuous advancement of the electronics industry, printed circuit boards are widely used in products such as computers, electronic communication devices, network switches, etc. Taking a network switch as an example, the network switch is provided with a plurality of printed circuit board assemblies therein. Each of the printed circuit board assemblies is a printed circuit board on which a plurality of electronic components have been assembled.

Each of the printed circuit board assemblies is provided with the electronic components, a plurality of jacks, a plurality of chips, etc. with different functions, so that each of the printed circuit board assemblies has a large number of connectors. When two printed circuit board assemblies are mounted to each other, a plurality of connectors of one of the printed circuit board assemblies need to be accurately and correspondingly inserted into a plurality of connectors of the other printed circuit board assembly, otherwise a contact on the connectors would be damaged.

In addition, when the size of each of the printed circuit board assemblies is large, a user needs to use a considerable force for holding one of the printed circuit board assemblies and inserting one of the printed circuit board assemblies into the other of the printed circuit board assemblies to connect the two printed circuit board assemblies during assembly. It is worth mentioning that, if the force is applied unevenly or excessively, the connectors would be damaged, thereby affecting the stability and quality of the electrical connection of the printed circuit board assemblies.

Furthermore, as the electronic components, the jacks, and the chips are distributed on the printed circuit board assemblies, when the user assembles the printed circuit board assemblies with bare hands, it is not easy for the user to apply the force or risks of injury might be easily resulted in a process of applying the force. For example, the hands of the user are inadvertently scratched by the electronic components, the jacks, or the chips.

BRIEF SUMMARY OF THE INVENTION

In view of the above, the primary objective according to the present disclosure is to provide a circuit board mounting and demounting device, which could prevent a user from directly touching circuit boards.

Another primary objective according to the present disclosure is to provide a data processing device, wherein the user is assisted in combining a circuit board with another circuit board by using a mechanical linkage, so that the circuit board could be moved in a force-saving manner and could be accurately aligned with the another circuit board, thereby improving the stability and quality of the electrical connection between the circuit board and the another circuit board.

In order to achieve the above objective, the present disclosure provides a circuit board mounting and demounting device, which is used with at least one guide and fulcrum device, including at least one actuation mechanism, wherein the at least one actuation mechanism includes a substrate and a linkage assembly. The substrate is adapted to fixedly connect to a second circuit board and having at least one second guiding portion for being guided by the at least one guide and fulcrum device; the linkage assembly includes an actuating rod and a pivot shaft, wherein the actuating rod is pivotally disposed on the substrate by the pivot shaft and is pivotable between a first position and a second position; when one end of the actuating rod abuts against the at least one guide and fulcrum device and the actuating rod is pivoted between the first position and the second position with the pivot shaft as a fulcrum, the substrate is moved in a guiding direction of the at least one guide and fulcrum device.

In one embodiment, the substrate has two second guiding portions which are disposed at an interval and are tracks extending in a same direction; the linkage assembly is located between the two second guiding portions.

In one embodiment, the actuating rod includes a wrench element and a linkage element; the linkage element has a pivoting portion and a shank portion which are connected to each other; the pivot shaft pivotally passes through the pivoting portion and the substrate; the shank portion has a linkage aperture; one end of the wrench element is pivotally connected to the substrate and is driven by the actuating rod when the actuating rod pivots; the wrench element has a linkage protrusion which passes through the linkage aperture; when the actuating rod is pivoted from the first position to the second position, the linkage protrusion of the wrench element is driven to slide along the linkage aperture, thereby driving the linkage element to pivot the actuating rod from the first position to the second position with the pivot shaft as the fulcrum.

In one embodiment, the linkage assembly further includes a driven element; one end of the driven element is pivotally connected to the wrench element of the actuating rod; the other end of the driven element is connected to a protrusion; the substrate has a first stop portion and a second stop portion, wherein the first stop portion is further away from the wrench element of the actuating rod than the second stop portion; when the actuating rod is pivoted between the first position and the second position, the protrusion is driven to move between the first stop portion and the second stop portion; when the actuating rod is located at the first position, the protrusion of the driven element is fitted in the first stop portion; when the actuating rod is located at the second position, the protrusion of the driven element is fitted in the second stop portion.

In one embodiment, the substrate has a top edge; the first stop portion and the second stop portion are recesses formed on the top edge respectively; the linkage assembly further includes an elastic element; one end of the elastic element is fixed to the substrate and the other end of the elastic element is fixed to the driven element, so that the protrusion of the driven element selectively falls into the first stop portion or the second stop portion while sliding along the top edge.

In one embodiment, the at least one actuation mechanism includes two actuation mechanisms; the two actuation mechanisms are disposed at an interval and are arranged in parallel; a handle is connected between the wrench element of one of the two actuation mechanisms and the wrench element of the other of the two actuation mechanisms.

In one embodiment, the at least one actuation mechanism includes two actuation mechanisms; the two actuation mechanisms are disposed at an interval and are arranged in parallel; a connecting rod is connected between the other end of the driven element of one of the two actuation mechanisms and the other end of the driven element of the other of the two actuation mechanisms, and the two protrusions of the two actuation mechanisms are two ends of the connecting rod.

In one embodiment, when the two actuating rods of the two actuation mechanisms are located at the first position, the two ends of the connecting rod are respectively fitted in the two first stop portions of the two actuation mechanisms; when the two actuating rods of the two actuation mechanisms are located at the second position, the two ends of the connecting rod are respectively fitted in the two second stop portions of the two actuation mechanisms.

The present disclosure further provides a data processing device, including at least one guide and fulcrum device and a circuit board mounting and demounting device. The at least one guide and fulcrum device includes at least one first guiding portion and a post portion; the at least one guide and fulcrum device is located at a fixed position relative to a first circuit board; the circuit board mounting and demounting device includes at least one actuation mechanism; wherein the at least one actuation mechanism includes a substrate and a linkage assembly; the substrate is adapted to fixedly connect to a second circuit board and has at least one second guiding portion; the at least one second guiding portion is adapted to engage with the at least one first guiding portion and the at least one second guiding portion is adapted to guide by the at least one first guiding portion; the linkage assembly includes an actuating rod and a pivot shaft, wherein the actuating rod is pivotally disposed on the substrate by the pivot shaft and is pivotable between a first position and a second position; the actuating rod has a notch portion; when the actuating rod is pivoted from the first position to the second position, the notch portion is in contact with the post portion and applies a force on the post portion, and the substrate is driven to move from a third position to a fourth position through the at least one second guiding portion along a guiding direction of the at least one first guiding portion; when the substrate is located at the fourth position, the second circuit board is combined with the first circuit board.

In one embodiment, the at least one first guiding portion of the at least one guide and fulcrum device includes two first guiding portions; the at least one second guiding portion of the substrate includes two second guiding portions; either the two first guiding portions or the two second guiding portions are tracks, and the other of the two first guiding portions and the two second guiding portions are dowel pins.

In one embodiment, the two first guiding portions are dowel pins; the two first guiding portions are disposed at an interval and the post portion is located between the two first guiding portions; the two second guiding portions are disposed at an interval and are tracks extending in a same direction; a distance of the interval of the two second guiding portions is equal to a distance of the interval of the two first guiding portions; the two second guiding portions are adapted to engage with the two first guiding portions.

In one embodiment, the actuating rod of the at least one actuation mechanism includes a wrench element and a linkage element; the linkage element has a pivoting portion and a shank portion which are connected to each other; the pivot shaft pivotally passes through the pivoting portion and the substrate; the shank portion has a linkage aperture; the notch portion is formed around the pivoting portion; one end of the wrench element is pivotally connected to the substrate and is driven by the actuating rod when the actuating rod pivots; the wrench element has a linkage protrusion which passes through the linkage aperture; when the actuating rod is pivoted from the first position to the second position, the linkage protrusion of the wrench element is driven to slide along the linkage aperture, thereby driving the linkage element to pivot the actuating rod from the first position to the second position with the pivot shaft as the fulcrum.

In one embodiment, the linkage assembly further includes a driven element and an elastic element; one end of the driven element is pivotally connected to the wrench element of the actuating rod; the other end of the driven element is connected to a protrusion; one end of the elastic element is fixed to the substrate and the other end of the elastic element is fixed to the driven element; a first stop portion and a second stop portion are respectively formed on a top edge of the substrate; when the actuating rod is pivoted between the first position and the second position, the protrusion is driven to move between the first stop portion and the second stop portion along the top edge; the elastic element makes the protrusion of the driven element selectively falls into the first stop portion or the second stop portion while the protrusion of the driven element slides along the top edge.

In one embodiment, the at least one guide and fulcrum device includes two guide and fulcrum devices; the at least one actuation mechanism includes two actuation mechanisms; the two guide and fulcrum devices are disposed at an interval and are located at the fixed position relative to the first circuit board; the two actuation mechanisms are disposed at an interval on the second circuit board; a handle is connected between the wrench element of one of the two actuation mechanisms and the wrench element of the other of the two actuation mechanisms.

In one embodiment, the at least one guide and fulcrum device includes two guide and fulcrum devices; the at least one actuation mechanism includes two actuation mechanisms; the two guide and fulcrum devices are disposed at an interval and are arranged in parallel; the two actuation mechanisms are disposed at an interval and are arranged in parallel; a connecting rod is connected between the other end of the driven element of one of the two actuation mechanisms and the other end of the driven element of the other of the two actuation mechanisms, and the two protrusions of the two actuation mechanisms are two ends of the connecting rod.

In one embodiment, when the two actuating rods of the two actuation mechanisms are located at the first position, the two ends of the connecting rod are respectively fitted in the two first stop portions of the two actuation mechanisms; when the two actuating rods of the two actuation mechanisms are located at the second position, the two ends of the connecting rod are respectively fitted in the two second stop portions of the two actuation mechanisms.

In one embodiment, the post portion is a dowel; the notch portion is a V-shaped notch and abuts against the post portion.

When the circuit board mounting and demounting device is mounted on the second circuit board and the actuating rod is pushed to move the second circuit board and finally to combine the second circuit board with the first circuit board, the second circuit board could be moved along the pre-set guiding direction of the two second guiding portions through the two second guiding portions cooperating with the two first guiding portions. In this way, the second connectors of the second circuit board could be accurately aligned with the first connectors of the first circuit board and inserted into the first connectors of the first circuit board, thereby preventing the first connectors and the second connectors from being damaged by impact. As the user directly applies the force on the handle or the actuating rod without touching the second circuit board, when the second circuit board is combined with the first circuit board, so that the hands of the user could be prevented from being scratched by electronic components and the force could be evenly applied to drive the second circuit board to be combined with the first circuit board, thereby improving the stability and quality of the electrical connection between the second circuit board and the first circuit board.

BRIEF DESCRIPTION OF THE SEVERAL VIEWS OF THE DRAWINGS

The present disclosure will be best understood by referring to the following detailed description of some illustrative embodiments in conjunction with the accompanying drawings, in which.

DETAILED DESCRIPTION OF THE INVENTION

Figure 1:
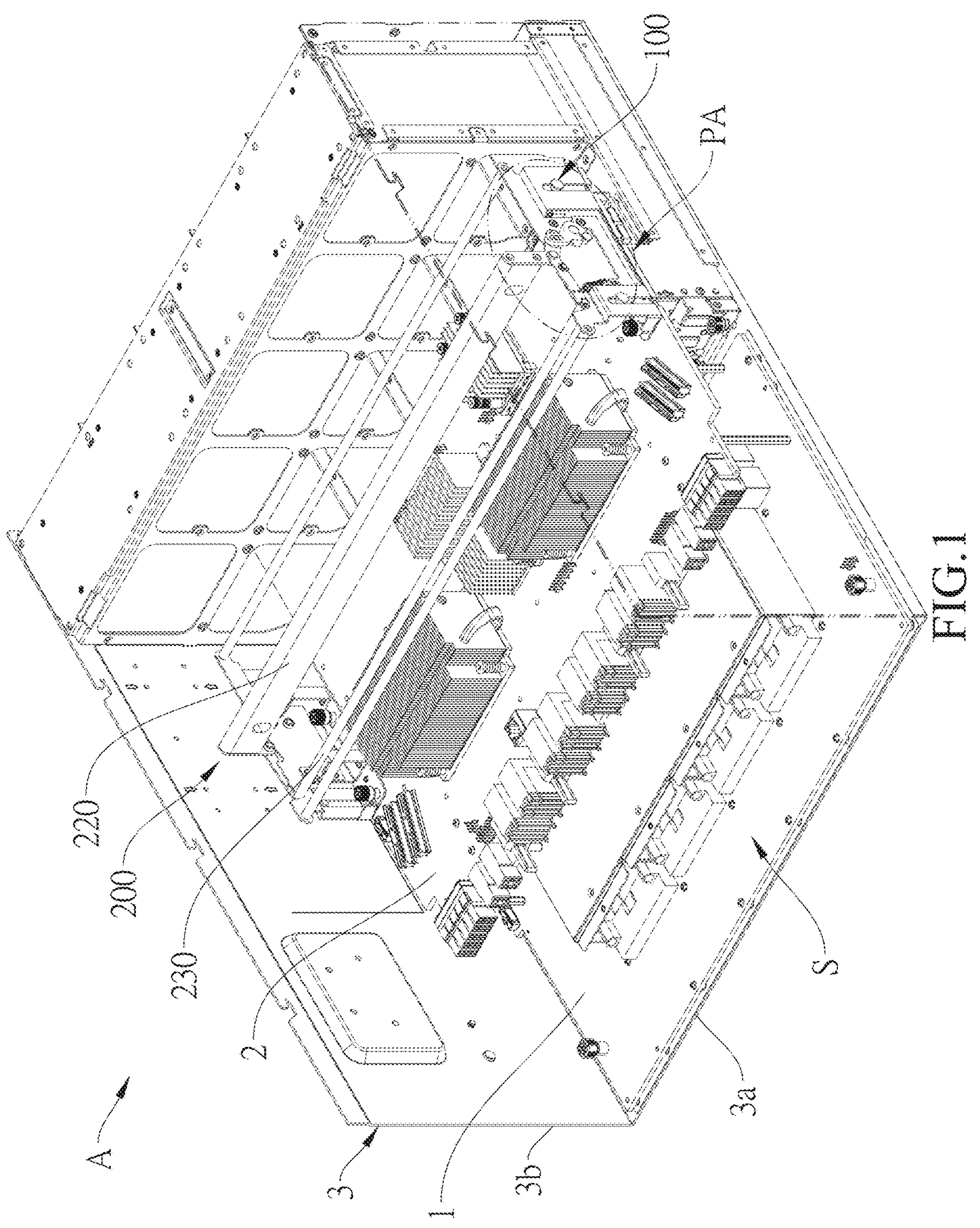
FIG. 1 is a perspective view of the data processing device of a first embodiment according to the present disclosure.

As illustrated in FIG. 1 to FIG. 4, a data processing device A of a first embodiment according to the present disclosure includes at least one guide and fulcrum device 100 and a circuit board mounting and demounting device 200. The at least one guide and fulcrum device 100 and the circuit board mounting and demounting device 200 are cooperated to mount a second circuit board 2 onto a first circuit board 1. In addition, a position of the first circuit board 1 is fixed relative to a position of the at least one guide and fulcrum device 100. In the first embodiment, the first circuit board 1 and the at least one guide and fulcrum device 100 are disposed in an accommodating space S. The accommodating space S is composed of a casing 3 and the at least one guide and fulcrum device 100 is disposed on the casing 3. The casing 3 could be an outer casing that covers or accommodates the data processing device A, wherein the data processing device A could be a network switch, a server, etc.

In the first embodiment, the casing 3 includes a bottom plate **3*a* and two side plates 3*b*. The bottom plate 3*a* is a plate. The two side plates 3*b* are connected to two edges of two sides of the bottom plate 3*a*. In this way, the two side plates 3*b* are disposed at an interval on the two sides of the bottom plate 3*a*, and the two side plates 3*b* and the bottom plate 3*a* jointly surround to form the accommodating space S. In the accommodating space S, the first circuit board 1 is fixedly disposed on the bottom plate 3*a* and the second circuit board 2 is located at a mounting position relative to the first circuit board 1. The first circuit board 1 and the second circuit board 2 are electrically connected through connectors of the first circuit board 1 and connectors of the second circuit board 2** that correspond each other.

In the first embodiment, the data processing device A includes two guide and fulcrum devices 100 which are disposed at an interval and are arranged side by side. Each of the guide and fulcrum devices 100 is disposed on each of the side plates **3*b* and is located at a fixed position relative to the first circuit board 1. Each of the guide and fulcrum devices 100 includes two first guiding portions 110 and a post portion 120. The two first guiding portions 110 are disposed at an interval. In the first embodiment, each of the first guiding portions 110 is a dowel pin. The post portion 120 is located between the first guiding portions 110. In the first embodiment, the post portion 120** is a dowel.

The circuit board mounting and demounting device 200 includes two actuation mechanisms 210, a handle 220, and a connecting rod 230. The two actuation mechanisms 210, which are disposed at an interval and are arranged in parallel, are adapted to fixedly connect to two sides of the second circuit board 2, thereby fixing the circuit board mounting and demounting device 200 on the second circuit board 2. The actuation mechanisms 210 could be connected to the second circuit board 2 by screwing, clamping, magnetic attachment, but not limited thereto. In the first embodiment, the two second actuation mechanisms 210 are connected to the second circuit board 2 by screwing. In this way, the second circuit board 2 could be controlled to move relative to the first circuit board 1 by operating the circuit board mounting and demounting device 200.

More specifically, each of the actuation mechanisms 210 includes a substrate 10 and a linkage assembly 20. The substrate 10 is fastened to the second circuit board 2 by fastening elements 11, thereby fixing the circuit board mounting and demounting device 200 on the second circuit board 2. The substrate 10 has two second guiding portions 12 for being engaged with the first guiding portions 110. The second circuit board 2 fastened to the actuation mechanisms 210 could be moved within a moving range relative to the first circuit board 1. In the first embodiment, the second guiding portions 12 are tracks.

Figure 5:
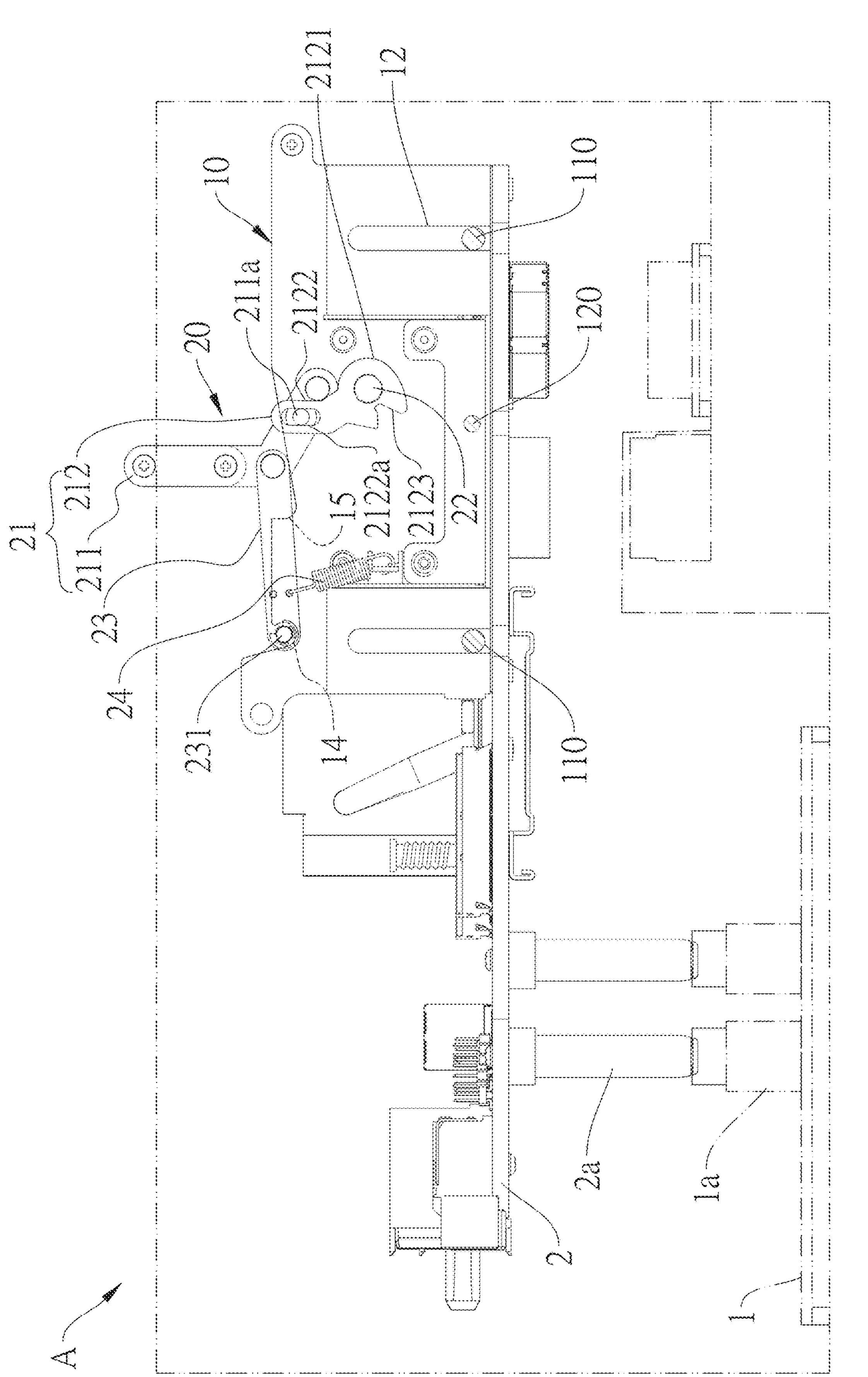
FIG. 5 is a schematic view of the data processing device of the first embodiment according to the present disclosure, showing the second guiding portions of the substrate cooperates with the first guiding portions of the guide and fulcrum device.
Figure 6:
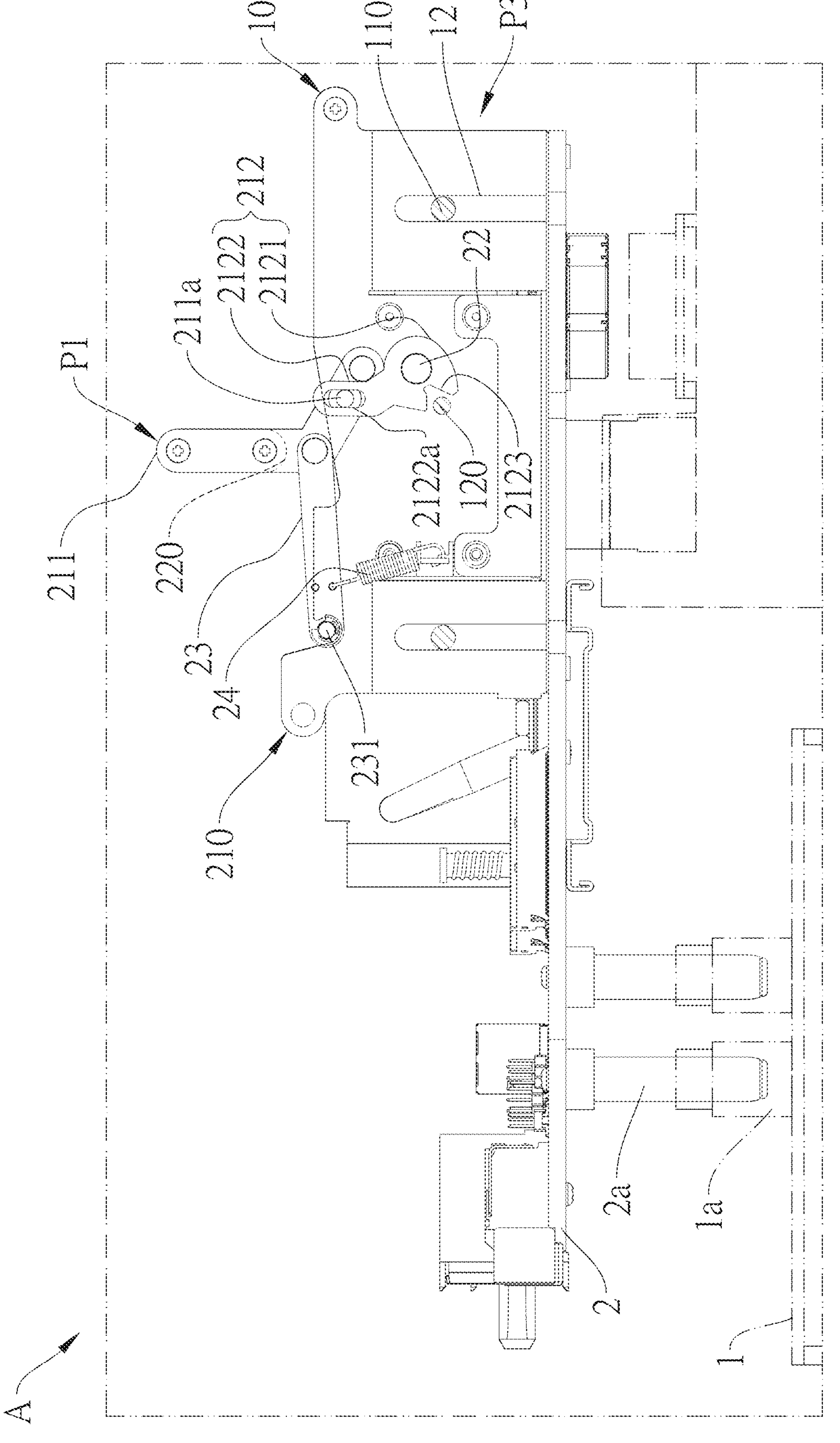
FIG. 6 is a schematic view of FIG. 5, showing the actuating rod is located at the first position and the substrate is located at the third position.
Figure 7:
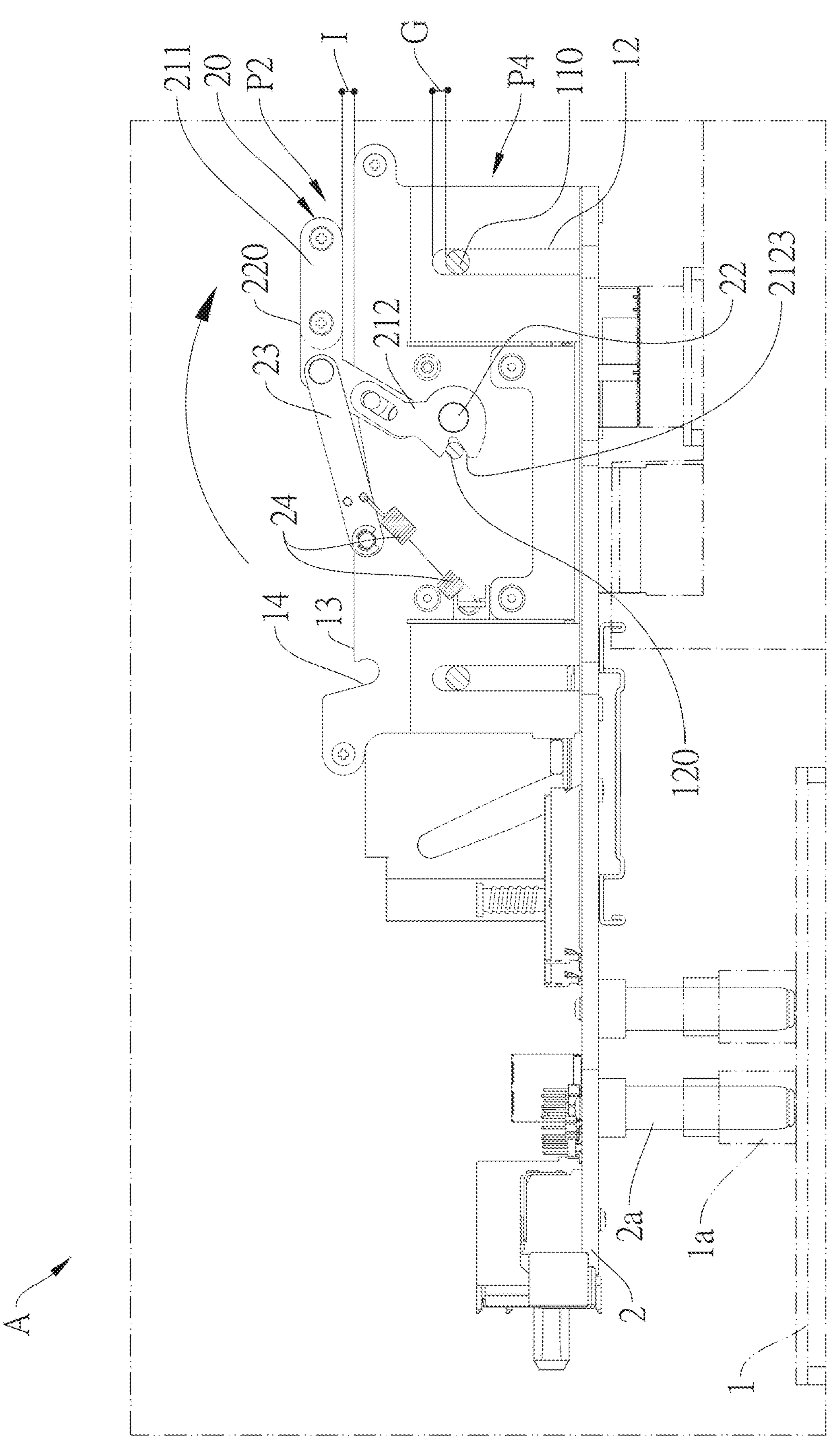
FIG. 7 is a schematic view of FIG. 6, showing the actuating rod is moved to the second position and the substrate is moved to the fourth position, so that the second circuit board is mounted onto the first circuit board.

Referring to FIG. 5 to FIG. 7, the linkage assembly 20 includes an actuating rod 21, a pivot shaft 22, a driven element 23, and an elastic element 24. The actuating rod 21 includes a wrench element 211 and a linkage element 212. The wrench element 211 is a curved structure. One end of the wrench element 211 is connected to the substrate 10 in a pivotable manner relative to the substrate 10. The wrench element 211 has a linkage protrusion 211*a*. The linkage element 212 has a pivoting portion 2121 and a shank portion 2122 which are connected to each other. The pivot shaft 22 pivotally passes through the pivoting portion 2121 and the substrate 10, so that the linkage element 212 could be pivotally connected to the substrate 10. A notch portion 2123 is formed around the pivoting portion 2121 and is adapted to abut against the post portion 120. In the first embodiment, the notch portion 2123 is a V-shaped notch. The shank portion 2122 has a linkage aperture 2122*a*. The linkage protrusion 211*a* of the wrench element 211 passes through the linkage aperture 2122*a*. One end of the driven element 23 is pivotally connected to a curved portion at a middle of the wrench element 211 of the actuating rod 21. The other end of the driven element 23 is connected to a protrusion 231. One end of the elastic element 24 is fixed to the substrate 10 and the other end of the elastic element 24 is fixed to the driven element 23. In the embodiment, the elastic element 24 is a spring.

In the first embodiment, the substrate 10 cooperating with the linkage assembly 20 has a top edge 13. A first stop portion 14 and a second stop portion 15 are respectively formed by recessing downwards at two different positions of the top edge 13. The first stop portion 14 and the second stop portion 15 are recesses A position of the first stop portion 14 is far away from the wrench element 211, and a position of the second stop portion 15 is close to the wrench element 211; that is, the first stop portion 14 is further away from the wrench element 211 of the actuating rod 21 than the second stop portion 15. When the elastic element 24 makes the protrusion 231 connected to the driven element 23 slide along the top edge 13, the protrusion 231 of the driven element 23 selectively falls into the first stop portion 14 or the second stop portion 15 due to an extension of the elastic element 24.

One end of the handle 220 is connected to the wrench element 211 of one of the actuation mechanisms 210 and the other end of the handle 220 is connected to the wrench element 211 of the other of the actuation mechanisms 210, so that strokes of the actuation mechanisms 210 are consistent during operation.

Figure 2:
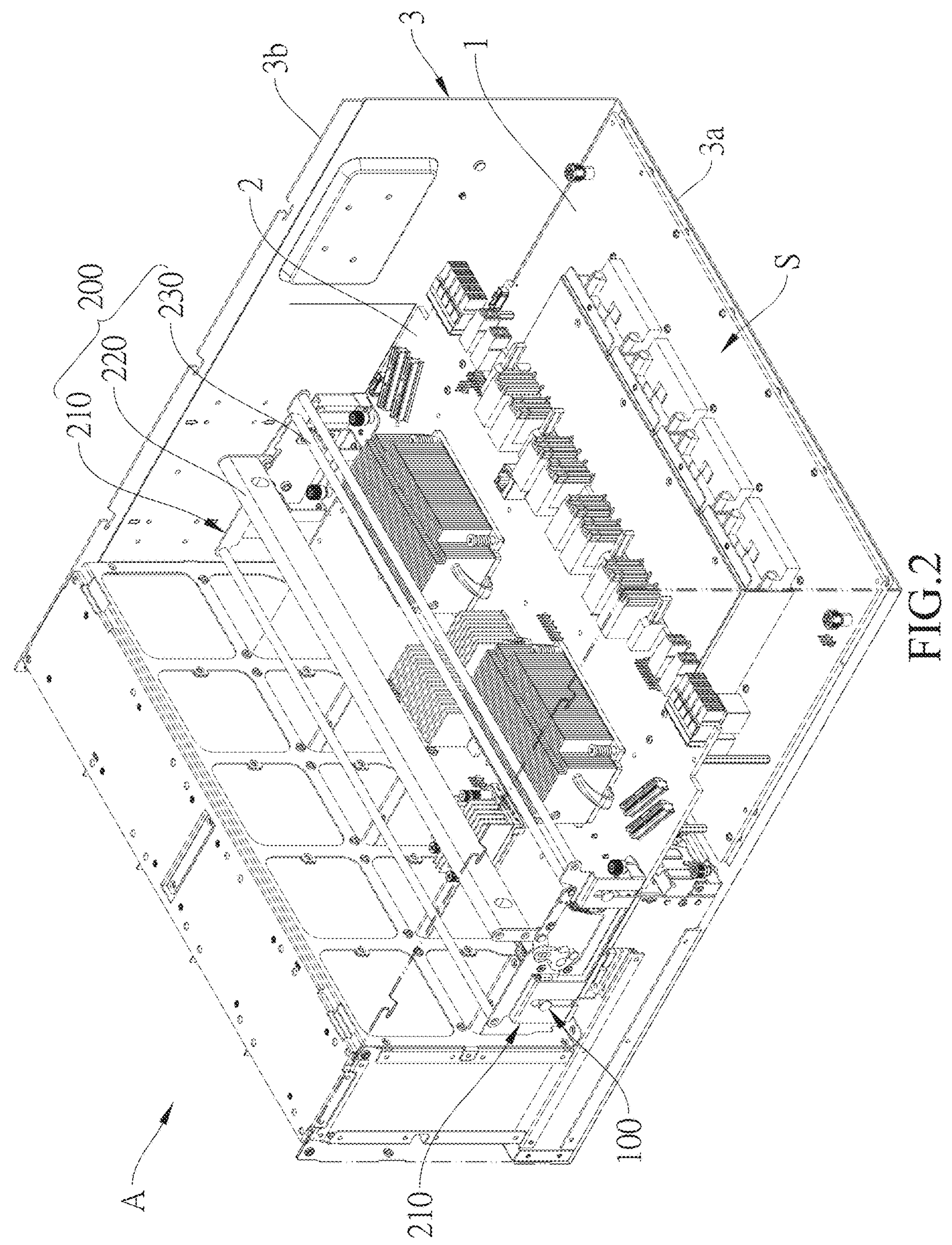
FIG. 2 is a perspective view of the data processing device of the first embodiment according to the present disclosure seen from another perspective.
Figure 3:
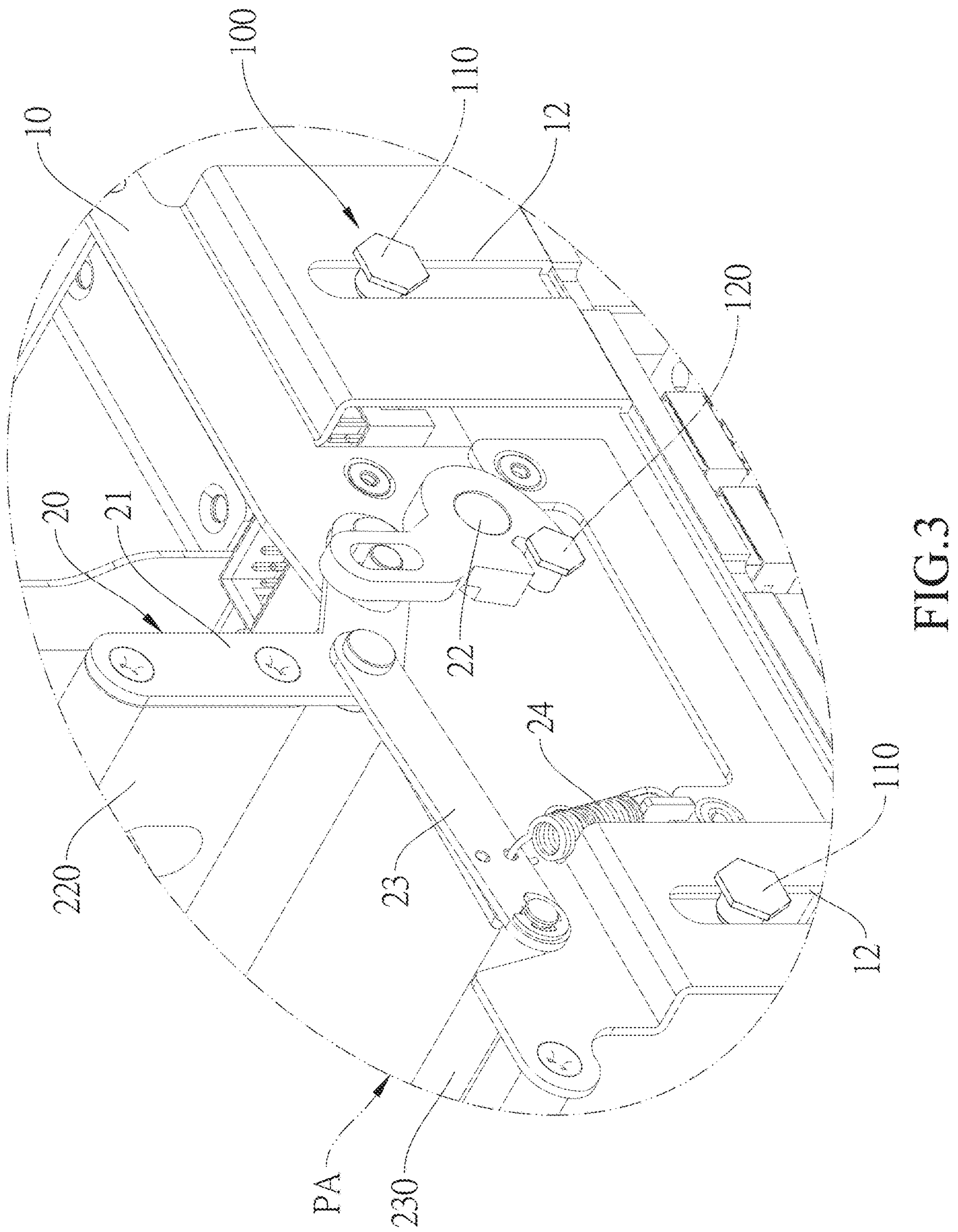
FIG. 3 is a partially enlarged view of a marked region PA in FIG. 1.
Figure 4:
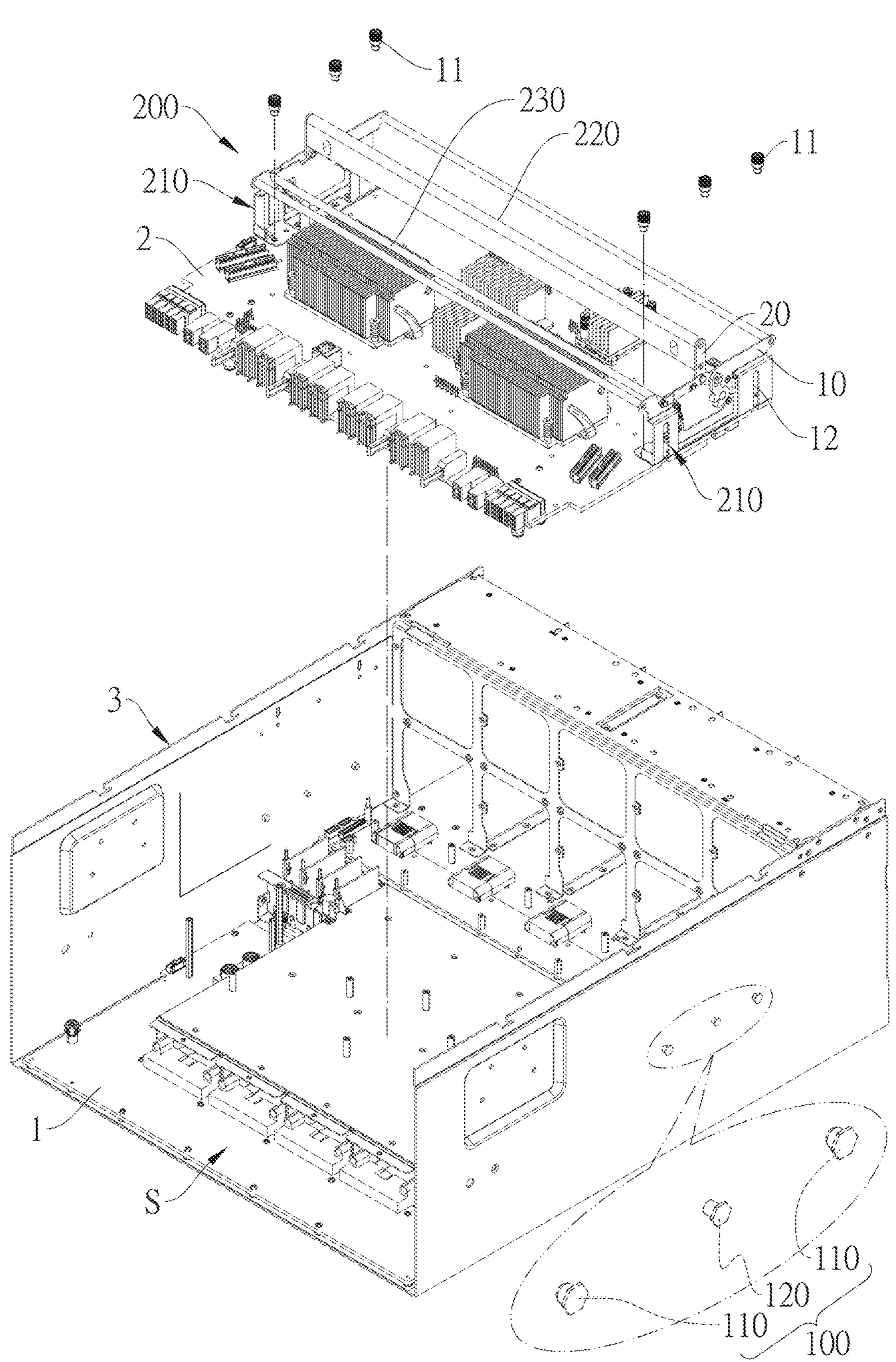
FIG. 4 is an exploded view of FIG. 1, showing the second circuit board is detached from the first circuit board.

Referring to FIG. 1 to FIG. 3, two ends of the connecting rod 230 are respectively connected to the other ends of the driven elements 23 of the two actuation mechanisms 210. In the first embodiment, the two ends of the connecting rod 230 respectively form the protrusions 231 of the other ends of the driven elements 23. The connecting rod 230 could be pivoted along with the handle 220 or the actuating rod 21, so that the two ends of the connecting rod 230 could be moved between the first stop portions 14 and the second stop portions 15, thereby improving a stability of the protrusions 231 being fitted in the first stop portions 14 or the second stop portions 15. In other embodiments, the connecting rod 230 could be omitted and each of the protrusions 231 could be a protruding post.

Referring to FIG. 5, during operation, the two second guiding portions 12 of each of the substrates 10 are engaging the two first guiding portions 110 of each of the guide and fulcrum devices 100, and a plurality of second connectors 2*a* of the second circuit board 2 are aligned with a plurality of first connectors 1*a* of the first circuit board 1. Referring to FIG. 6, the handle 220 (the two actuating rods 21) is in an upright state, which is defined as being at a first position P1. At that time, the two ends of the connecting rod 230 (the two protrusions 231) are respectively fitted in the two first stop portions 14. As the two second guiding portions 12 of each of the substrates 10 are fitted around the two first guiding portions 110, each of the substrates 10 is moved towards the first circuit board 1 through the two second guiding portions 12 along a guiding direction of the two first guiding portions 110 until the two notch portions 2123 of the two linkage elements 212 abut against the two post portions 120; in this state, the two substrates 10 are defined as being at a third position P3. Referring to FIG. 7, when the handle 220 (the two actuating rods 21) is pushed towards the two substrates 10, the two ends the connecting rod 230 (the two protrusions 231) are respectively driven to be fitted in the two second stop portions 15; in this state, the handle 220 (the two actuating rods 21) is defined as being at a second position P2. The two substrates 10 are moved when the handle 220 (the two actuating rods 21) is pivoted from the first position P1 to the second position P2, so that the second connectors 2*a* of the second circuit board 2 are inserted into the first connectors 1*a* of the first circuit board 1; in this state, the two substrates 10 are defined as being at a fourth position P4.

Referring to FIG. 6 to FIG. 7, when the second circuit board 2 is going to be mounted to the first circuit board 1 through the circuit board mounting and demounting device 200, the two substrates 10 are located at the third position P3 and the two notch portions 2123 abut against the two post portions 120 respectively. When a user pushes down the handle 220 (the two actuating rods 21) to pivot the handle 220 (the two actuating rods 21) from the first position P1 to the second position P2, the two ends of the connecting rod 230 (the two protrusions 231) are detached from the two first stop portions 14 during the process of pivoting the handle 220 (the two actuating rods 21) from the first position P1 to the second position P2. Then, the handle 220 (the two actuating rods 21) is continuously pushed down towards the two substrates 10, so that the two ends of the connecting rod 230 (the two protrusions 231) are driven to slide along the top edge 13 towards the two second stop portions 15 and each of the linkage protrusions 211*a* is driven to slide along each of the linkage apertures 2122*a*. Therefore, the linkage elements 212 are driven to pivot the handle 220 (the two actuating rods 21) from the first position P1 to the second position P2 with the pivot shafts 22 as fulcrums and the post portions 120 as loads. Finally, when the handle 220 (the two actuating rods 21) is located at the second position P2, the two ends of the connecting rod 230 (the two protrusions 231) are fitted in the two second stop portions 15, and the two substrates 10 are moved from the third position P3 to the fourth position P4. In this way, the second circuit board 2 is combined with the first circuit board 1.

On the contrary, as the handle 220 (the two actuating rods 21) is located at the second position P2, a space I is provided between the handle 220 (the two actuating rods 21) and each of the substrates 10 and a gap G is provided between a closed end of each of the second guiding portions 12 and each of the first guiding portions 110, so that the handle 220 (the two actuating rods 21) could be continuously pushed down in the space I. When the second circuit board 2 is about to be detached from the first circuit board 1, the handle 220 (the two actuating rods 21) is pushed down, so that each of the substrates 10 is slightly moved downwards and the closed end of each of the second guiding portions 12 is in contact with each of the first guiding portions 110. At that time, the two ends of the connecting rod 230 (the two protrusions 231) are moved out of the two second stop portions 15 to release the handle 220 (the two actuating rods 21). During a process of pivoting the handle 220 (the two actuating rods 21) from the second position P2 to the first position P1, each of the linkage protrusions 211*a* is driven to slide along each of the linkage apertures 2122*a*, thereby driving each of the linkage elements 212 to pivot the two ends of the connecting rod 230 (the two protrusions 231) from the second position P2 to the first position P1 with the pivot shafts 22 as the fulcrums. At the same time, the two ends of the connecting rod 230 (the two protrusions 231) are driven to slide along the top edge 13 from the two second stop portions 15 to the two first stop portions 14, and each of the substrates 10 could be driven to move from the fourth position P4 to the third position P3 in a guiding direction of the two second guiding portions 12. In this way, the second circuit board 2 is moved up and detached from the first circuit board 1.

When the user pushes the handle 220 (the two actuating rods 21) to move the handle 220 (the two actuating rods 21) from the first position P1 to the second position P2, the two substrates 10 are driven to move from the third position P3 to the fourth position P4, thereby combining the second circuit board 2 with the first circuit board 1. In this way, the user could apply the force directly on the handle 220 (the two actuating rods 21) without touching the second circuit board 2, which prevents the hands of the user from being scratched by electronic components. In addition, the handle 220 and the connecting rod 230 are connected to the two actuation mechanisms 210, so that the circuit board mounting and demounting device 200 has a more consistent stroke during operation.

In the first embodiment, the data processing device A includes the handle 220; in other embodiments, the handle 220 could be omitted, i.e., the user directly pushes the two actuating rods 21 to pivot the two actuating rods 21 from the first position P1 to the second position P2, thereby driving the substrates 10 to move from the third position P3 to the fourth position P4. In the first embodiment, the two ends of the connecting rod 230 form the two protrusions 231. In other embodiment, the connecting rod 230 could be omitted, as long as the two protrusions 231 could be selectively fitted into the two first stop portions 14 or the two second stop portions 15; for example, two protrusions 231, which are columns, could be directly engaged with the other ends of the two driven elements 23. Furthermore, the data processing device A includes the two guide and fulcrum devices 100 and the two actuation mechanisms 210. In practice, when the circuit board mounting and demounting device 200 is used to mount the second circuit board 2, which has a smaller area, to the first circuit board 1, the data processing device A could be provided with only one guide and fulcrum device 100 and the circuit board mounting and demounting device 200 could be provided with only one actuation mechanism 210 for cooperating with the guide and fulcrum device 100.

Figure 8:
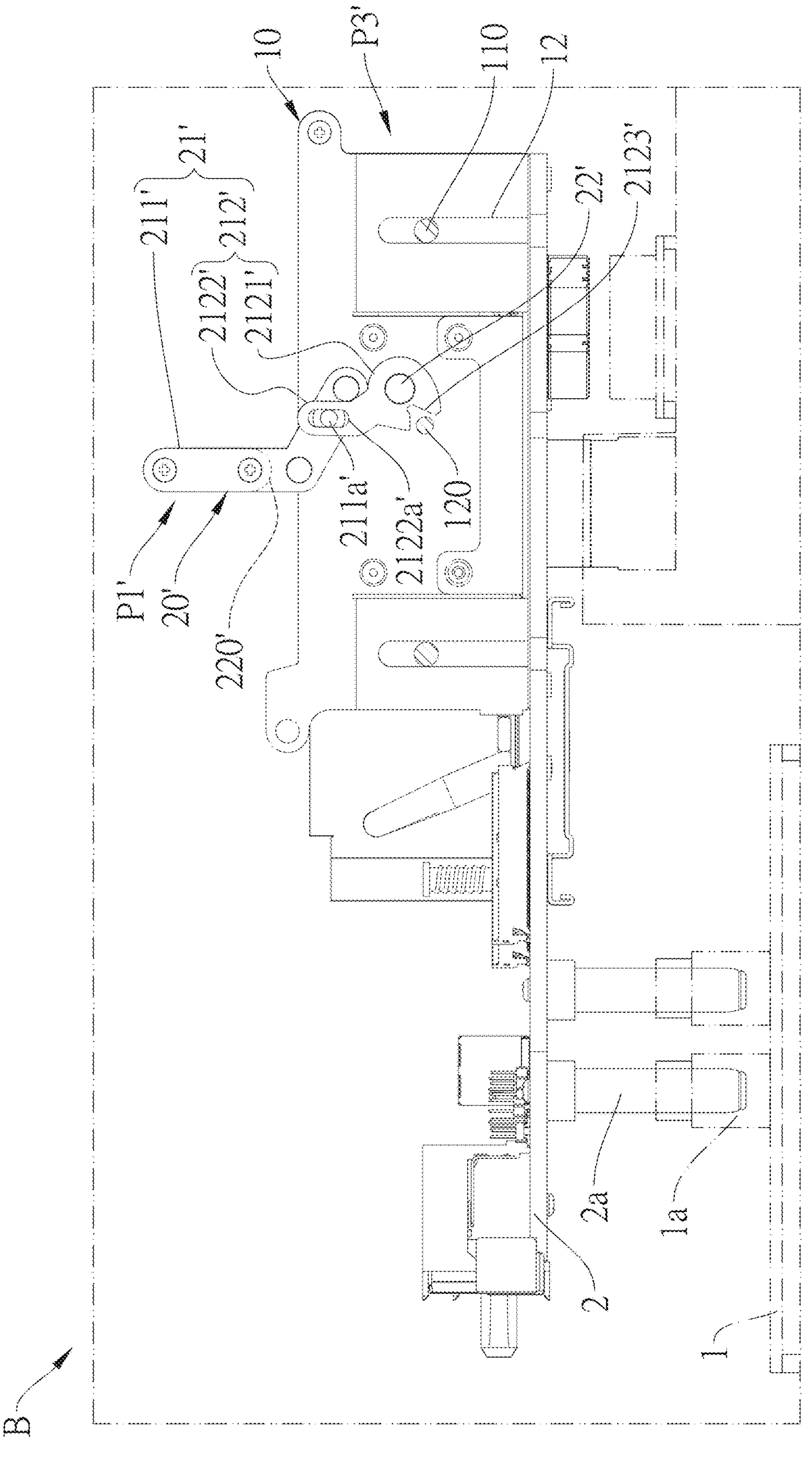
FIG. 8 is a schematic view of the data processing device of a second embodiment according to the present disclosure, showing the actuating rod is located at the first position and the substrate is located at the third position.
Figure 9:
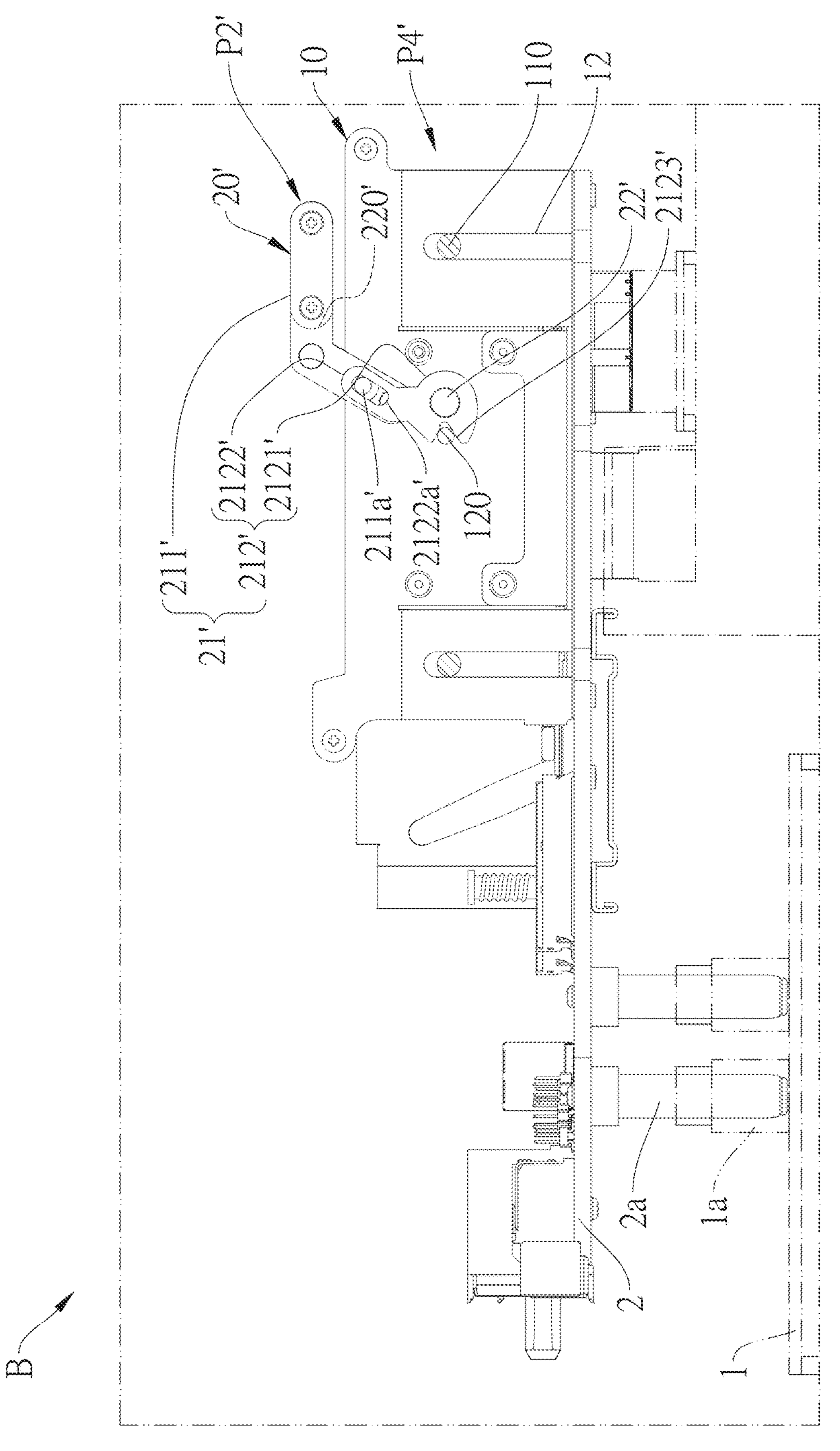
FIG. 9 is a schematic view of FIG. 8, showing the actuating rod is moved to the second position and the substrate is moved to the fourth position, so that the second circuit board is mounted onto the first circuit board.

Referring to FIG. 8 to FIG. 9, a data processing device B of a second embodiment according to the present disclosure is almost in the same structure as the data processing device A of the first embodiment according to the present disclosure. The difference between the first embodiment and the second embodiment is that in the second embodiment, the connecting rod 230 is omitted from a circuit board mounting and demounting device 200 of the data processing device B, the first stop portion 14 and the second stop portion 15 are omitted from each of two substrates 10, and the driven element 23 and the elastic element 24 are omitted from an actuating rod 21' of each of two linkage assemblies 20'. The data processing device B in the second embodiment could achieve the same effect as in the first embodiment; the differences between the data processing device B and the data processing device A are explained in detail in the following.

Each of the two linkage assemblies 20' includes the actuating rod 21' and a pivot shaft 22'. The actuating rod 21' includes a wrench element 211' and a linkage element 212'. The wrench element 211' is a curved structure. One end of the wrench element 211' is pivotally connected to the substrate 10. The wrench element 211' has a linkage protrusion 211*a'*. The linkage element 212' has a pivoting portion 2121' and a shank portion 2122' which are connected to each other. The pivot shaft 22' pivotally passes through the pivoting portion 2121' and the substrate 10, so that the linkage element 212' could be pivotally connected to the substrate 10. A notch portion 2123' is formed around the pivoting portion 2121' and is adapted to abut against the post portion 120. In the second embodiment, the notch portion 2123' is a V-shaped notch. The shank portion 2122' has a linkage aperture 2122*a'*. The linkage protrusion 211*a'* of the wrench element 211' passes through the linkage aperture 2122*a'* of the shank portion 2122'.

In the second embodiment, in order to make a stroke of the circuit board mounting and demounting device 200 consistent during operation, a handle 220' is connected between the two actuation mechanisms 210. The structure and the effect of the handle 220' of the second embodiment are the same as that of the handle 220 of the first embodiment, and are not repeated here.

The aforementioned is related to the structure of the data processing device B in the second embodiment. An operation of the data processing device B is further described in the following.

Referring to FIG. 8, the handle 220' (the two actuating rods 21') is in an upright state, which is defined as being at a first position P1'. At that time, as the two second guiding portions 12 of each of the substrates 10 are fitted around the two first guiding portions 110, each of the substrates 10 is moved towards the first circuit board 1 through the two second guiding portions 12 along the guiding direction of the two first guiding portions 110 until the two notch portions 2123' of the two linkage elements 212' abut against the two post portions 120; in this state, the two substrates 10 are defined as being at a third position P3'. Referring to FIG. 9, the handle 220' (the two actuating rods 21') is pushed towards the two substrates 10 until each of the linkage protrusions 211*a'* abuts against an edge of each of the linkage apertures 2122*a'*; in this state, the handle 220' (the two actuating rods 21') is defined as being at a second position P2'. In this way, the handle 220' (the two actuating rods 21') could be pivoted between the first position P1' and the second position P2'. The two substrates 10 are moved when the handle 220' (the two actuating rods 21') is pivoted from the first position P1' to the second position P2', so that the second connectors 2*a* of second circuit board 2 are inserted into the first connectors 1*a* of the first circuit board 1; in this state, the two substrates 10 are defined as being at a fourth position P4'.

Referring to FIG. 8 to FIG. 9, when the second circuit board 2 is going to be mounted to the first circuit board 1 through the circuit board mounting and demounting device 200, the two substrates 10 are located at the third position P3' and the two notch portions 2123' abut against the two post portions 120 respectively. When a user pushes down the handle 220' (the two actuating rods 21') to pivot the handle 220' (the two actuating rods 21') from the first position P1' to the second position P2', each of the linkage protrusions 211*a'* is driven to slide along each of the linkage apertures

2122*a*', thereby causing the linkage elements 212' to pivot the handle 220' (the two actuating rods 21') from the first position P1' to the second position P2' with the pivot shafts 22' as fulcrums and the post portions 120 as loads. Each of the linkage protrusions 211*a*' slides along each of the linkage apertures 2122*a*' until each of the linkage protrusions 211*a*' abuts against the edge of each of the linkage apertures 2122*a*'. At that time, when the handle 220' (the two actuating rods 21') is located at the second position P2', the two substrates 10 are moved from the third position P3' to the fourth position P4'. In this way, the second circuit board 2 is combined with the first circuit board 1.

On the contrary, when the second circuit board 2 is about to be detached from the first circuit board 1, the handle 220' (the two actuating rods 21') is directly pivoted from the second position P2' to the first position P1' and the two substrates 10 are moved from the fourth position P4' to the third position P3' through the two second guiding portions 12 cooperating with the two first guiding portions 110. In this way, the second circuit board 2 is moved up and detached from the first circuit board 1.

In other embodiments, the handle 220' could be omitted and the force could be directly applied to the two actuating rods 21', i.e., the user directly pushes the two actuating rods 21' to pivot the two actuating rods 21' from the first position P1' to the second position P2', thereby driving the substrates 10 to move from the third position P3' to the fourth position P4'.

Figure 10:
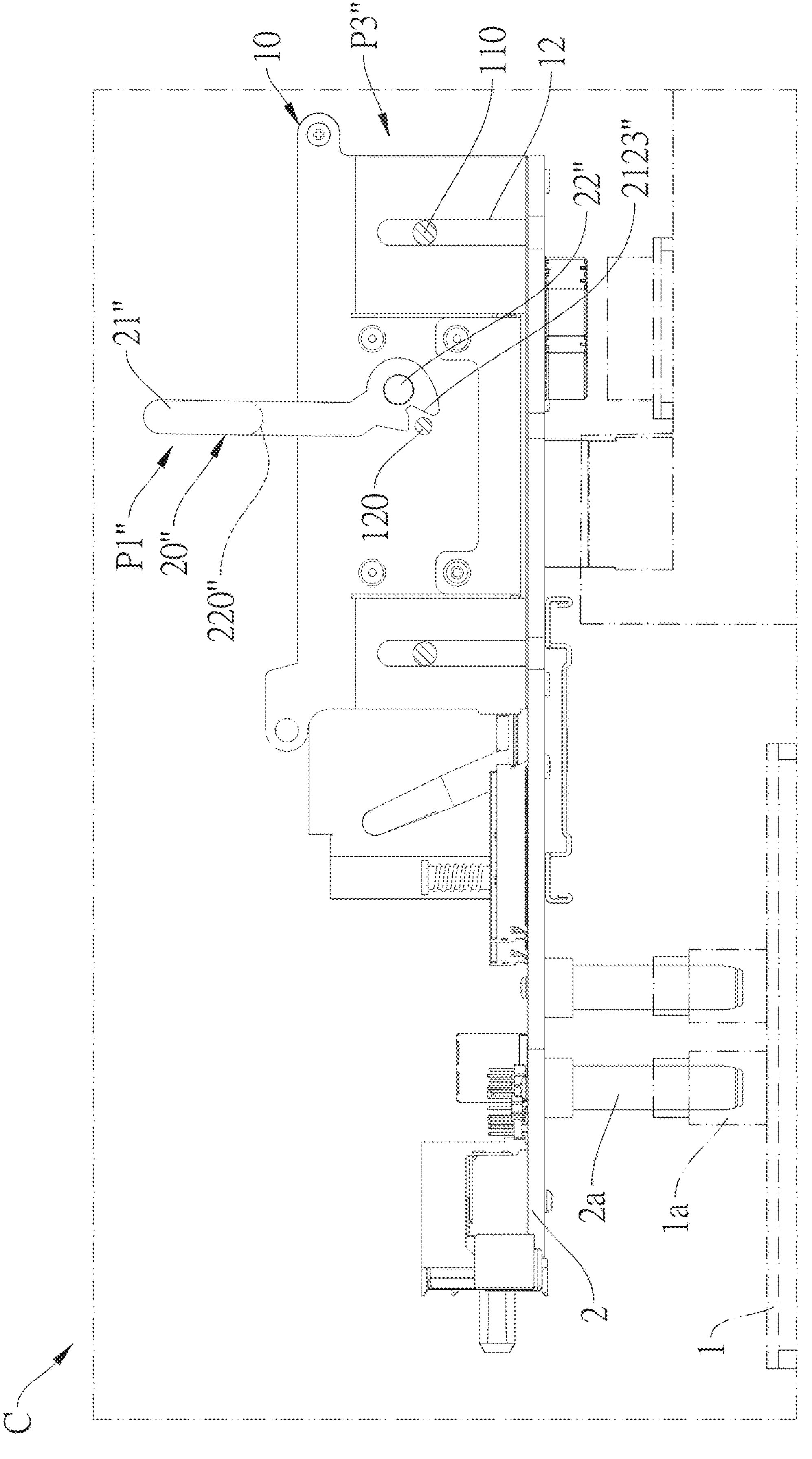
FIG. 10 is a schematic view of the data processing device of a third embodiment according to the present disclosure, showing the actuating rod is located at the first position and the substrate is located at the third position.
Figure 11:
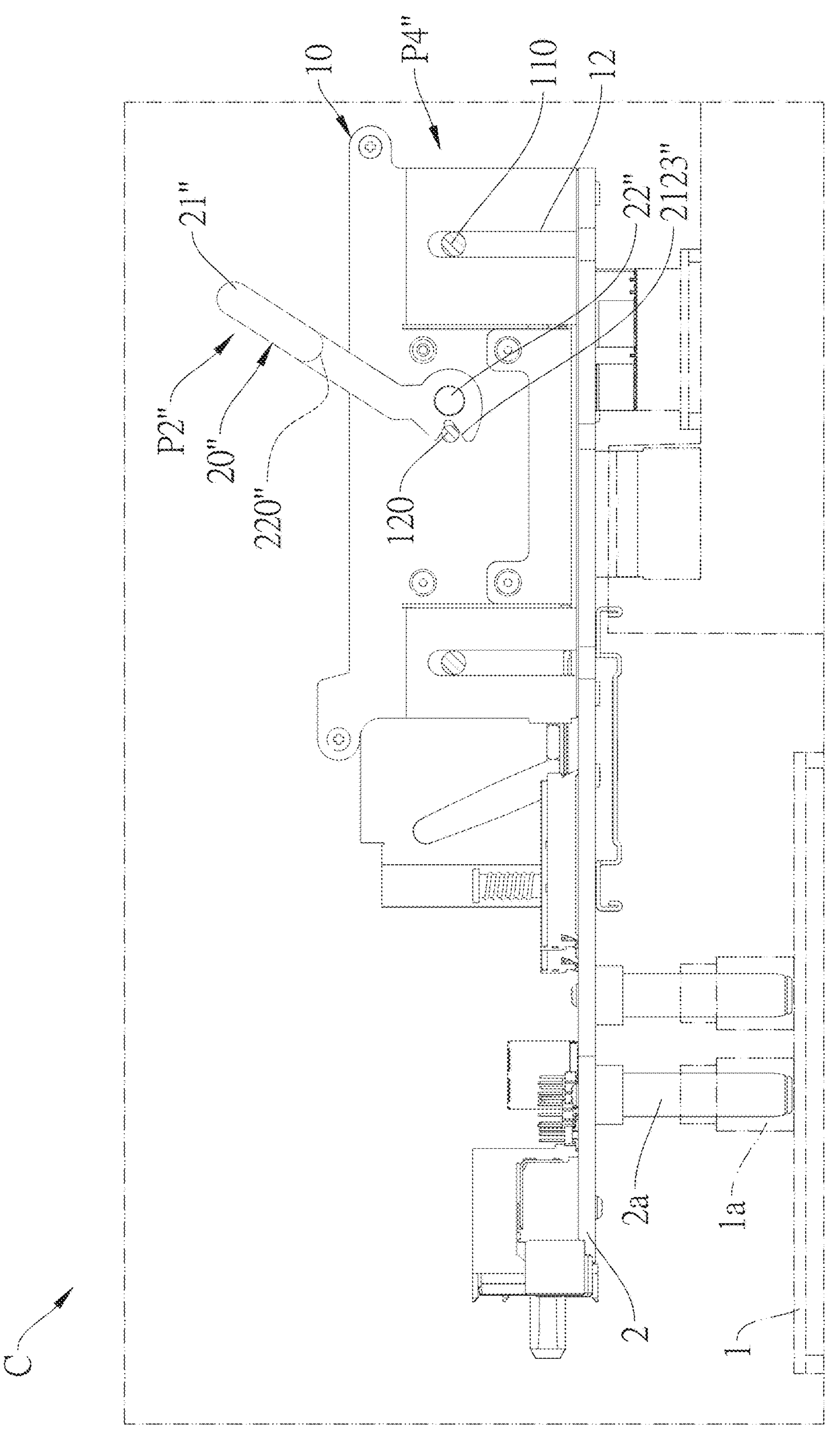
FIG. 11 is a schematic view of FIG. 10, showing the actuating rod is moved to the second position and the substrate is moved to the fourth position, so that the second circuit board is mounted onto the first circuit board.

Referring to FIG. 10 to FIG. 11, a data processing device C of a third embodiment according to the present disclosure is almost in the same structure as the data processing device B of the second embodiment according to the present disclosure, except that an actuating rods 21" of each of two linkage assemblies 20" of the third embodiment is integrally formed as a single unit, i.e., the wrench element 211' of the second embodiment and the linkage element 212' of the second embodiment are combined into a single component, and the linkage protrusion 211*a*' and the linkage aperture 2122*a*' of the second embodiment are omitted, which could achieve the same effect as in the second embodiment.

Each of the two linkage assemblies 20" includes the actuating rod 21" and a pivot shaft 22". The actuating rod 21" is pivotally disposed on the substrate 10 by the pivot shaft 22", so that the actuating rod 21" could be pivoted relative to the substrate 10. The actuating rod 21" has a notch portion 2123". The notch portion 2123" is located around the pivot shaft 22" and is adapted to abut against the post portion 120. In the third embodiment, the notch portion 2123" is a V-shaped notch.

In the third embodiment, in order to make a stroke of the circuit board mounting and demounting device 200 consistent during operation, a handle 220" is disposed between the two actuation mechanisms 210. One end of the handle 220" is connected to the actuating rod 21" of one of the linkage assemblies 20" and the other end of the handle 220" is connected to the actuating rod 21" of the other of the linkage assemblies 20". In this way, a user could directly apply the force on the handle 220" to make the stroke of the circuit board mounting and demounting device 200 consistent, and hands of the user could be prevented from being scratched by electronic components, thereby improving the stability and quality of the electrical connection between the second circuit board 2 and the first circuit board 1.

The aforementioned is the structure of the data processing device C of the third embodiment according to the present disclosure. An operation of the data processing device C is further described in the following. Referring to FIG. 10, the handle 220" (the two actuating rods 21") is in an upright state, which is defined as being at a first position P1". At that time, as the two second guiding portions 12 are fitted around the two first guiding portions 110, each of the substrates 10 is moved towards the first circuit board 1 through the two second guiding portions 12 along the guiding direction of the two first guiding portions 110 until the two notch portions 2123" respectively abut against the two post portions 120; in this state, the two substrates 10 are defined as being at a third position P3". Referring to FIG. 11, the handle 220" (the two actuating rods 21") is pushed towards the two substrates 10 until the second connectors 2*a* of the second circuit board 2 are inserted into the first connectors 1*a* of the first circuit board 1; in this state, the handle 220" (the two actuating rods 21") is defined as being at a second position P2" and the two substrates 10 are defined as being at a fourth position P4".

Referring to FIG. 10 to FIG. 11, when the second circuit board 2 is going to be mounted to the first circuit board 1 through the circuit board mounting and demounting device 200, the two substrates 10 are located at the third position P3" and the two notch portions 2123" abut against the two post portions 120 respectively. The user pushes down the handle 220" (the two actuating rods 21") to pivot the handle 220" (the two actuating rods 21") from the first position P1" to the second position P2". During the process of pivoting the handle 220" (the two actuating rods 21") from the first position P1" to the second position P2", each of the two notch portions 2123" is in contact with each of the two post portions 120 and applies the force to each of the two post portions 120, and the handle 220" (the two actuating rods 21") uses each of the two pivot shafts 22" as a fulcrum to drive each of the two substrates 10 to move from the third position P3" to the fourth position P4" with the two second guiding portions 12 cooperating with the two first guiding portions 110. In this way, the second circuit board 2 is combined with the first circuit board 1.

On the contrary, when the second circuit board 2 is about to be detached from the first circuit board 1, the handle 220" (the two actuating rods 21") is directly pivoted from the second position P2" to the first position P1" and the two substrates 10 are moved from the fourth position P4" to the third position P3" through the two second guiding portions 12 cooperating with the two first guiding portions 110. In this way, the second circuit board 2 is moved up and detached from the first circuit board 1.

In other embodiments, the handle 220" could be omitted and the force could be directly applied to the two actuating rods 21", i.e., the user directly pushes the two actuating rods 21" to pivot the two actuating rods 21" from the first position P1" to the second position P2", thereby driving the substrates 10 to move from the third position P3" to the fourth position P4".

With the aforementioned data processing devices A, B, C, when the actuating rod 21, 21', 21" is pivoted from the first position P1, P1', P1" to the second position P2, P2', P2", the notch portion 2123, 2123', 2123" is in contact with the post portion 120 and applies the force on the post portion 120. The actuating rod 21, 21', 21" makes use of the pivot shaft 22, 22', 22" as the fulcrum and the post portion 120 as the load to drive the substrate 10 to move from the third position P3, P3', P3" to the fourth position P4, P4', P4" along the guiding direction of the two second guiding portions 12. In this way, the second circuit board 2 is combined with the first circuit board 1. In addition, the second connectors 2*a* of the second circuit board 2 are accurately aligned with the first connectors 1*a* of the first circuit board 1 by the two first guiding portions 110 cooperating with the two second guiding portions 12. In this way, the user applies the force directly on the actuating rod 21, 21', 21", so that the hands of the user could be prevented from being scratched by the second connectors 2*a* or the first connectors 1*a* and the second circuit board 2 could be combined with the first circuit board 1 by the more evenly applied force, thereby improving the stability and quality of the electrical connection between the second circuit board 2 and the first circuit board 1.

It is worth mentioning that, the number of the first guiding portion 110 of the guide and fulcrum device 100 of the first embodiment, the number of the first guiding portion 110 of the guide and fulcrum device 100 of the second embodiment, and the number of the first guiding portion 110 of the guide and fulcrum device 100 of the third embodiment are two respectively. In other embodiments, the number of the first guiding portion 110 could be one; the first guiding portion 110 and the post portion 120 are fixed on the side plate 3*b* inside the casing 3 and are fixed relative to the second circuit board 2; the number of the second guiding portion 12 of the actuation mechanism 210 is one to correspond to the number of the first guiding portion 110. The guiding effect could be achieved by engaging one second guiding portion 12 with one first guiding portion 110.

In other embodiments, a shape of each of the two first guiding portions 110 and a shape of each of the second guiding portions 12 could be exchanged. That is, the two first guiding portions 110 are tracks and disposed at an interval; the two first guiding portion 110 are dowel pins and disposed at an interval; a distance of the interval of the two second guiding portions 12 is equal to a distance of the interval of the two first guiding portions 110 and the post portion 120 is still located between the two first guiding portions 110.

It must be pointed out that the embodiments described above are only some preferred embodiments of the present disclosure. All equivalent structures which employ the concepts disclosed in this specification and the appended claims should fall within the scope of the present disclosure.

What is claimed is:

1. A circuit board mounting and demounting device, which is used with at least one guide and fulcrum device, comprising at least one actuation mechanism, wherein the at least one actuation mechanism comprises: a substrate adapted to fixedly connect to a second circuit board and having at least one second guiding portion for being guided by the at least one guide and fulcrum device; and a linkage assembly comprising an actuating rod and a pivot shaft, wherein the actuating rod is pivotally disposed on the substrate by the pivot shaft and is pivotable between a first position and a second position; when one end of the actuating rod abuts against the at least one guide and fulcrum device and the actuating rod is pivoted between the first position and the second position with the pivot shaft as a fulcrum, the substrate is movable in a guiding direction of the at least one guide and fulcrum device; and the actuating rod comprises a wrench element and a linkage element; the linkage element has a pivoting portion and a shank portion which are connected to each other; the pivot shaft pivotally passes through the pivoting portion and the substrate; the shank portion has a linkage aperture; one end of the wrench element is pivotally connected to the substrate and is driven by the actuating rod when the actuating rod pivots; the wrench element has a linkage protrusion which passes through the linkage aperture; when the actuating rod is pivoted from the first position to the second position, the linkage protrusion of the wrench element is driven to slide along the linkage aperture, thereby driving the linkage element to pivot the actuating rod from the first position to the second position with the pivot shaft as the fulcrum.

2. The circuit board mounting and demounting device as claimed in claim 1, wherein the substrate has two second guiding portions which are disposed at an interval and are tracks extending in a same direction; the linkage assembly is located between the two second guiding portions.

3. The circuit board mounting and demounting device as claimed in claim 1, wherein the linkage assembly further comprises a driven element; one end of the driven element is pivotally connected to the wrench element of the actuating rod; the other end of the driven element is connected to a protrusion; the substrate has a first stop portion and a second stop portion, wherein the first stop portion is further away from the wrench element of the actuating rod than the second stop portion; when the actuating rod is pivoted between the first position and the second position, the protrusion is driven to move between the first stop portion and the second stop portion; when the actuating rod is located at the first position, the protrusion of the driven element is fitted in the first stop portion; when the actuating rod is located at the second position, the protrusion of the driven element is fitted in the second stop portion.

4. The circuit board mounting and demounting device as claimed in claim 3, wherein the substrate has a top edge; the first stop portion and the second stop portion are recesses formed on the top edge respectively; the linkage assembly further comprises an elastic element; one end of the elastic element is fixed to the substrate and the other end of the elastic element is fixed to the driven element, so that the protrusion of the driven element selectively falls into the first stop portion or the second stop portion while sliding along the top edge.

5. The circuit board mounting and demounting device as claimed in claim 3, wherein the at least one actuation mechanism comprises two actuation mechanisms; the two actuation mechanisms are disposed at an interval and are arranged in parallel; a handle is connected between the wrench element of one of the two actuation mechanisms and the wrench element of the other of the two actuation mechanisms.

6. The circuit board mounting and demounting device as claimed in claim 4, wherein the number of actuation mechanism is two and the two actuation mechanisms are disposed at an interval and are arranged in parallel; a connecting rod is connected between the other end of the driven element of one of the two actuation mechanisms and the other end of the driven element of the other of the two actuation mechanisms, and the two protrusions of the two actuation mechanisms are two ends of the connecting rod.

7. The circuit board mounting and demounting device as claimed in claim 6, wherein when the two actuating rods of the two actuation mechanisms are located at the first position, the two ends of the connecting rod are respectively fitted in the two first stop portions of the two actuation mechanisms; when the two actuating rods of the two actuation mechanisms are located at the second position, the two ends of the connecting rod are respectively fitted in the two second stop portions of the two actuation mechanisms.

8. A data processing device, comprising: at least one guide and fulcrum device comprising at least one first guiding portion and a post portion; the at least one guide and fulcrum device is located at a fixed position relative to a first circuit board; a circuit board mounting and demounting device comprising at least one actuation mechanism, wherein the at least one actuation mechanism comprises a substrate and a linkage assembly; the substrate is adapted to fixedly connect to a second circuit board and has at least one second guiding portion; the at least one second guiding portion is adapted to engage with the at least one first guiding portion and the at least one second guiding portion is adapted to guide by the at least one first guiding portion; the linkage assembly comprises an actuating rod and a pivot shaft, wherein the actuating rod is pivotally disposed on the substrate by the pivot shaft and is pivotable between a first position and a second position; the actuating rod has a notch portion; when the actuating rod is pivoted from the first position to the second position, the notch portion is in contact with the post portion and applies a force on the post portion, and the substrate is driven to move from a third position to a fourth position through the at least one second guiding portion along a guiding direction of the at least one first guiding portion; when the substrate is located at the fourth position, the second circuit board is combined with the first circuit board; and the two first guiding portions are dowel pins; the two first guiding portions are disposed at an interval and the post portion is located between the two first guiding portions; the two second guiding portions are disposed at an interval and are tracks extending in a same direction; a distance of the interval of the two second guiding portions is equal to a distance of the interval of the two first guiding portions; the two second guiding portions are adapted to engage with the two first guiding portions.

9. The data processing device as claimed in claim 8, wherein the at least one first guiding portion of the at least one guide and fulcrum device comprises two first guiding portions; the at least one second guiding portion of the substrate comprises two second guiding portions; either the two first guiding portions or the two second guiding portions are tracks, and the other of the two first guiding portions and the two second guiding portions are dowel pins.

10. The data processing device as claimed in claim 8, wherein the actuating rod of the at least one actuation mechanism comprises a wrench element and a linkage element; the linkage element has a pivoting portion and a shank portion which are connected to each other; the pivot shaft pivotally passes through the pivoting portion and the substrate; the shank portion has a linkage aperture; the notch portion is formed around the pivoting portion; one end of the wrench element is pivotally connected to the substrate and is driven by the actuating rod when the actuating rod pivots; the wrench element has a linkage protrusion which passes through the linkage aperture; when the actuating rod is pivoted from the first position to the second position, the linkage protrusion of the wrench element is driven to slide along the linkage aperture, thereby driving the linkage element to pivot the actuating rod from the first position to the second position with the pivot shaft as the fulcrum.

11. The data processing device as claimed in claim 10, wherein the linkage assembly further comprises a driven element and an elastic element; one end of the driven element is pivotally connected to the wrench element of the actuating rod; the other end of the driven element is connected to a protrusion; one end of the elastic element is fixed to the substrate and the other end of the elastic element is fixed to the driven element; a first stop portion and a second stop portion are respectively formed on a top edge of the substrate; when the actuating rod is pivoted between the first position and the second position, the protrusion is driven to move between the first stop portion and the second stop portion along the top edge; the elastic element makes the protrusion of the driven element selectively falls into the first stop portion or the second stop portion while the protrusion of the driven element slides along the top edge.

12. The data processing device as claimed in claim 10, wherein the at least one guide and fulcrum device comprises two guide and fulcrum devices; the at least one actuation mechanism comprises two actuation mechanisms; the two guide and fulcrum devices are disposed at an interval and are located at the fixed position relative to the first circuit board; the two actuation mechanisms are disposed at an interval on the second circuit board; a handle is connected between the wrench element of one of the two actuation mechanisms and the wrench element of the other of the two actuation mechanisms.

13. The data processing device as claimed in claim 11, wherein the at least one guide and fulcrum device comprises two guide and fulcrum devices; the number of actuation mechanism is two and the two actuation mechanisms are disposed at an interval and are arranged in parallel; the two guide and fulcrum devices are disposed at an interval and are arranged in parallel; a connecting rod is connected between the other end of the driven element of one of the two actuation mechanisms and the other end of the driven element of the other of the two actuation mechanisms, and the two protrusions of the two actuation mechanisms are two ends of the connecting rod.

14. The data processing device as claimed in claim 13, wherein when the two actuating rods of the two actuation mechanisms are located at the first position, the two ends of the connecting rod are respectively fitted in the two first stop portions of the two actuation mechanisms; when the two actuating rods of the two actuation mechanisms are located at the second position, the two ends of the connecting rod are respectively fitted in the two second stop portions of the two actuation mechanisms.

15. The data processing device as claimed in claim 8, wherein the post portion is a dowel; the notch portion is a V-shaped notch and abuts against the post portion.

* * * * *